United States Patent
Yang et al.

(10) Patent No.: US 6,383,048 B1
(45) Date of Patent: May 7, 2002

(54) PACKAGING METHOD FOR ORGANIC POLYMER EL DISPLAYS

(75) Inventors: Heng Long Yang, Hsintien; Jeng-Jen Li, Taipei; Rong-Ho Lee, Chiai Hsien, all of (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/480,469

(22) Filed: Jan. 10, 2000

(30) Foreign Application Priority Data

Aug. 31, 1999 (TW) ............................. 88114927

(51) Int. Cl.$^7$ ............................................. H05B 33/00
(52) U.S. Cl. ........................................ 445/24; 313/504
(58) Field of Search ........................... 445/24; 313/504, 313/506

(56) References Cited

U.S. PATENT DOCUMENTS 5,821,692 A * 10/1998 Rogers et al. ............... 313/506
5,952,778 A * 9/1999 Haskal et al. ................ 313/504
5,990,615 A * 11/1999 Sakaguchi et al. ........... 313/504
6,195,142 B1 * 2/2001 Gyotoku et al. ............. 313/504
6,198,217 B1 * 3/2001 Suzuki et al. ................ 313/504

* cited by examiner

Primary Examiner—Kenneth J. Ramsey
(74) Attorney, Agent, or Firm—Beyer Weaver & Thomas, LLP

(57) ABSTRACT

Disclosed is a novel packaging method for organic polymer EL displays characterized by passivating the organic polymer EL display with a heat-dissipating layer by sputtering deposition. By using this heat-dissipating layer, the heat generated by the EL display can be dissipated. In addition, this passivating and heat-dissipating layer can prevent the cathode and the polymer luminant layer from reacting to the oxygen and moisture in the air, thereby the degradation of the polymer EL display can be eliminated. Moreover, a packaging shell with grids set inside or covering layer consisting of material with high thermal conductivity is formed on the top of the heat-dissipating layer to consolidate the structure of the heat-dissipating mechanism and enhance the effect of heat-dissipation.

11 Claims, 6 Drawing Sheets

PACKAGING METHOD FOR ORGANIC POLYMER EL DISPLAYS

FIELD OF THE INVENTION

This invention relates to a packaging method, and particularly relates to a packaging method for organic polymer electroluminescent (EL) displays.

BACKGROUND OF THE INVENTION

The conjugated polymer poly(P-phenylene vinylene), or PPV, was first coated on the single layer EL device as a luminant layer by Cambridge University (UK) in 1990. The PPV and its derivatives were widely used to make organic polymer EL displays because the properties of these polymers are similar to semiconductors and easily processed.

The basic structure of the organic polymer EL display comprises an anode consisting of a transparent electrode, a cathode consisting of a metallic electrode, and an organic polymer EL layer sandwiched between the anode and the cathode. When forward bias is applied, the electrons injected by the cathode and the holes injected by the anode will recombine within the organic polymer luminant layer. Subsequently, excitons are formed. Photons are emitting when excitons decay to the ground state.

However, with increasing demands for luminance, the operating stability and the durability of the device must be improved. For example, the degeneration of the cathode is caused by oxidation or reacting to the moisture in the air. The luminance is also decreased because of the degradation of the organic polymer luminant layer. Therefore, when the cathode of the traditional EL display is formed, an extra packaging process is required to passivate the cathode and the organic polymer luminant layer and prevent the oxygen and moisture from affecting the cathode and the organic polymer ruminant layer; thereby, the oxidation or corrosion can be avoided.

The traditional packaging processes for organic polymer EL display are illustrated in FIG. 1A to FIG. 1D.

Figure 1A:
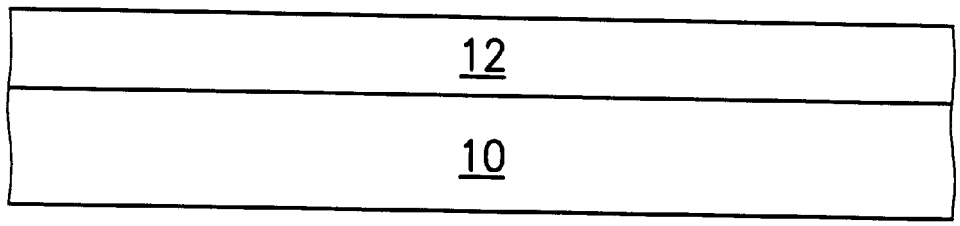

First, referring to FIG. 1A, an ITO glass 10 is provided. Then the ITO glass 10 is patterned into a plurality of blocks 12 as anodes of organic polymer EL display by means of photolithography and etching.

Figure 1B:
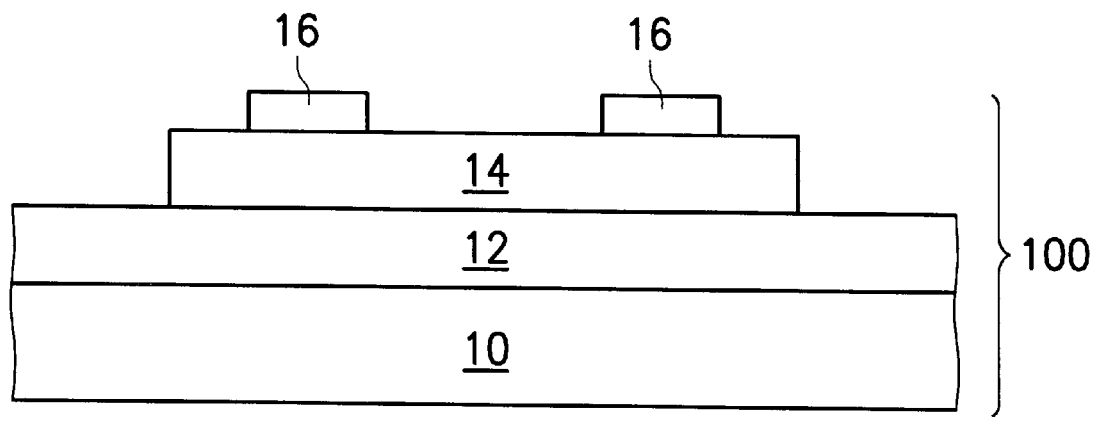

Next, referring to FIG. 1B, the luminant PPV is coated on the top of the ITO pattern 12 to form an organic polymer luminescent layer 14. Then, Al electrodes 16 are formed on the top of the organic polymer layer 14 as cathode of the organic polymer EL display, and an organic polymer EL display 100 is generated.

Figure 1C:
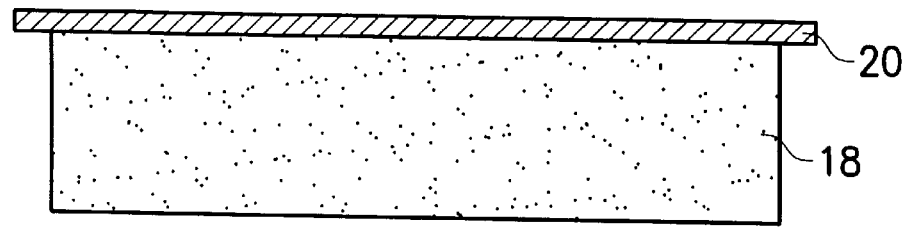
Figure 1C:
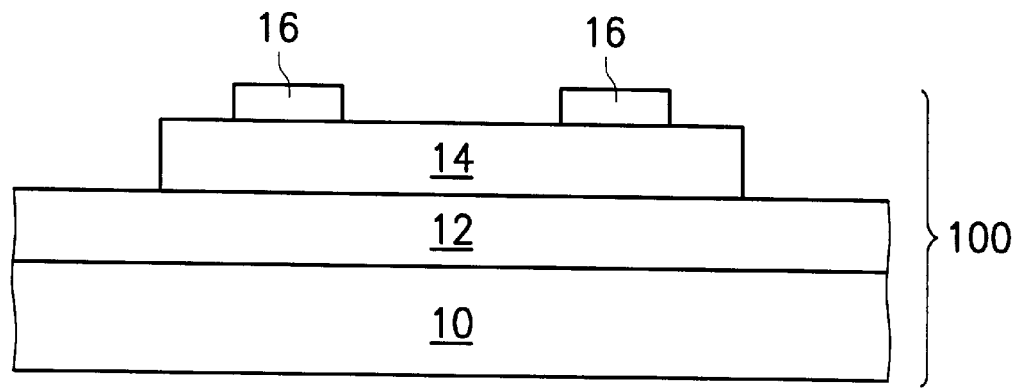
Figure 1D:
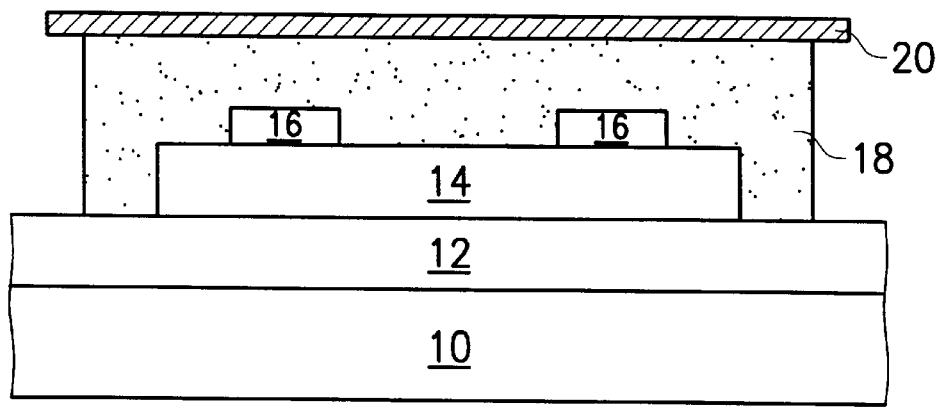

Next, referring to FIGS. 1C and 1D, a sealing glass 20 coated with epoxide resin 18 is provided. Finally, the organic polymer EL display 100 is packaged by joining with the sealing glass 20 as shown in FIG. 1D.

However, the organic polymer layer 14 is directly contacted with epoxide resin 18, which may cause the degradation phenomena. Moreover, the formation of Al electrodes 16 and the epoxy packaging method are two independent process. Therefore this traditional packaging method is not suitable for mass-production.

SUMMARY OF THE INVENTION

In order to address the drawbacks of the conventional packaging method for organic polymer EL displays described above, this invention discloses a novel packaging method for organic polymer EL displays.

One feature of the present invention is to provide a packaging method for organic polymer EL displays, the steps comprising: (1) providing a glass substrate with an EL display device formed thereon, comprises a transparent electrode used as an anode on the glass substrate, an organic polymer layer coated on the top of the anode, and a metallic electrode used as a cathode formed on the top of the organic polymer layer; (2) forming a heat-dissipating layer to cover the cathode and the organic polymer layer; and (3) providing a packaging shell with a plurality of grids set inside, and sealing the heat-dissipating layer under $N_2$.

In the packaging method described above, the transparent electrode consists of ITO. The organic polymer consists of organic luminant polymer materials, such as PPV or related series. The metallic electrode consists of electron-injecting materials, such as Al. The heat-dissipating layer consists of an insulator with high thermal conductivity, such as sputtered $AlN_x$. The packaging shell consists of metals with high thermal conductivity, such as Cu. In addition, the sealing step is performed by using an agglutinant, such as epoxide, to fix the packaging shell on the top of the heat-dissipating layer.

Another feature of this invention is to provide a packaging method for organic polymer EL displays, the steps comprising: (1) providing a glass substrate with an EL display device formed thereon, comprises a transparent electrode used as an anode on the glass substrate, an organic polymer layer coated on the top of the anode, and a metallic electrode used as a cathode formed on the top of the organic polymer layer; (2) forming a heat-dissipating layer to cover the cathode and the organic polymer layer; and (3) forming a covering layer on the top of the heat-dissipating layer.

In the packaging method described above, the transparent electrode consists of ITO. The organic polymer consists of organic luminant polymer materials, such as PPV or related series. The metallic electrode consists of electron-injecting materials, such as Al. The heat-dissipating layer consists of an insulator with high thermal conductivity, such as sputtered $AlN_x$. The covering layer consists of metals with high thermal conductivity, such as Cu.

Other feature and advantages of the invention will be apparent from the following detailed description, and from the claims.

BRIEF DESCRIPTION OF THE INVENTION

FIGS. 1A~1D are cross-sectional views of a conventional packaging process for organic polymer EL displays.

FIGS. 2A~2D are cross-sectional views of the packaging process for organic polymer EL displays according to embodiment 1 of this invention.

FIGS. 3A~3D are cross-sectional views of the packaging process for organic polymer EL display according to embodiment 2 of this invention.

DETAILED DESCRIPTION OF THE INVENTION

The present invention provides a novel packaging method for the organic polymer EL display, which is characterized by passivating the organic polymer EL display device with a heat-dissipating layer formed by sputtering. By using this heat-dissipating layer, the heat generated by the EL display can be dissipative. In addition, the heat-dissipating layer can also passivate the cathode and polymer luminant materials to prevent from reacting to the oxygen and moisture in the air, thereby the degradation of the EL display can be eliminated.

Moreover, the packaging shell with grids set inside or a metal layer can be formed on the top of the heat-eliminating layer to consolidate the structure of the heat-dissipating mechanism and enhance the effect of heat-dissipation. The packaging shell or the metal layer consists of materials with high thermal conductivity.

According to one packaging method of this present invention, an ITO glass is provided first, then patterned into a plurality of blocks as anodes by means of photolithography and etching.

Next, a luminant material consisting of organic polymers, such as PPV or related series is coated on the top of the ITO pattern to form a luminant layer. Then, metallic electrodes are deposited on the top of the luminant layer as cathodes of the organic polymer EL display. Consequently, an organic polymer EL display is generated.

Next, a heat-dissipating layer, consisting of materials with high thermal conductivity (e.g. aluminum nitride ($AlN_x$)), is formed to cover the cathodes and the luminant layer by sputtering.

A packaging shell with a plurality of grids set inside is sealed on the top of the heat-dissipating layer to consolidate the structure of the heat-dissipating mechanism and enhance the effects of heat-dissipation. The sealing process is performed by using an agglutinant, such as epoxide resin, to fix the packaging shell under $N_2$.

The packaging shell is used not only to consolidate the structure of the heat-dissipating mechanism but also prevent the cathode and the luminant layer from reacting to the oxygen and moisture by means of filling nitrogen between the packaging shell and the heat-dissipating layer.

According to another packaging method of this present invention, an ITO glass is also provided first, then patterned into a plurality of blocks as anodes by means of photolithography and etching.

Next, a luminant material consisting of organic polymers, such as PPV or related series is coated on the top of the ITO pattern to form a luminant layer. Then, metallic electrodes are deposited on the luminant layer as cathodes of the organic polymer EL display. Consequently, an organic polymer EL display is generated.

Next, a heat-dissipating layer, consisting of materials with high thermal conductivity (e.g. aluminum nitride ($AlN_x$)), is formed to cover the cathodes and the luminant layer by sputtering.

Then, a covering layer consisting of a metal with high thermal conductivity, such as copper, is deposited on the top of the heat-dissipating layer by sputtering. The covering layer is used not only to consolidate the structure of the heat-dissipating mechanism but also enhance the effect of heat-dissipation.

EMBODIMENT OF THE INVENTION

Embodiment 1

Figure 2A:
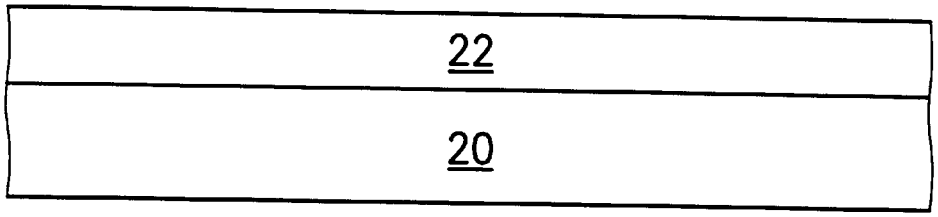

First, referring to FIG. 2A, an ITO glass 20 was provided. Then the ITO glass 20 was patterned into a plurality of blocks 22 as anodes of the organic polymer EL display by means of photolithography and etching.

Figure 2B:
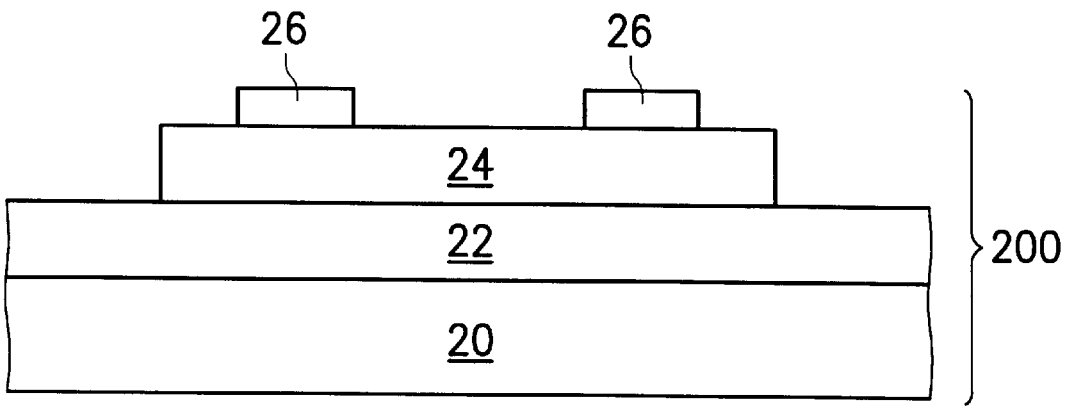

Next, referring to FIG. 2B, the luminant PPV or related series was coated on the top of the ITO pattern 12 to form an organic polymer luminant layer 24. Then, Al electrodes 26 were deposited on the top of the organic polymer luminant layer 24 as cathodes of the organic polymer EL display, and an organic polymer EL display 200 was generated.

Figure 2C:
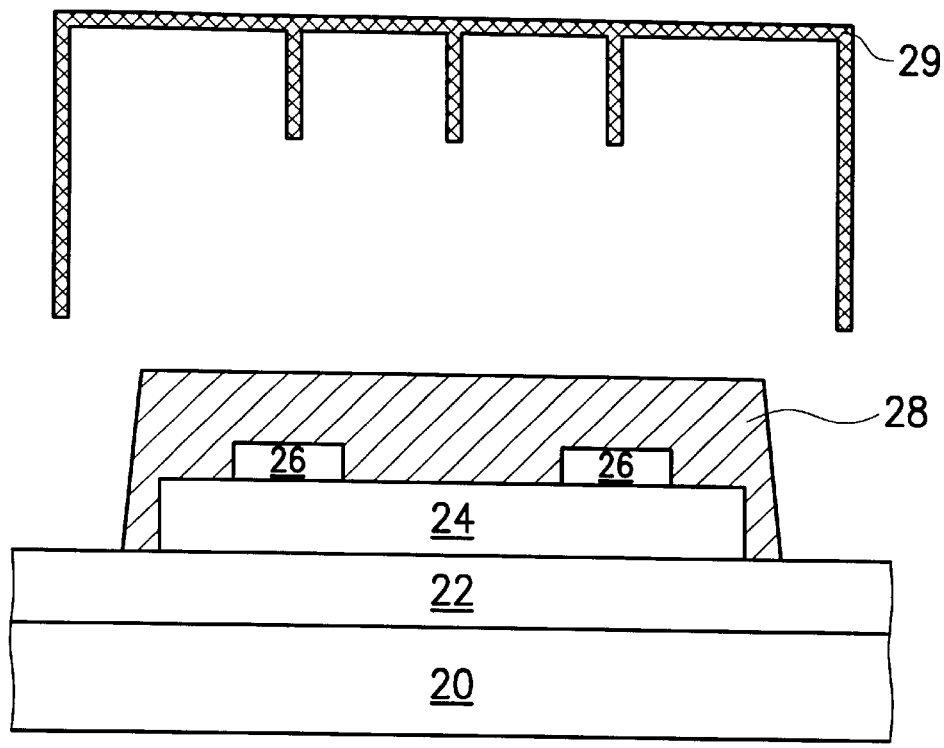

Next, referring to FIG. 2C, an aluminum nitride ($AlN_x$) layer 28 was deposited to cover Al electrodes 26 and the organic polymer luminant layer 24 by sputtering process. The aluminum nitride layer 28 can prevent Al electrodes and the organic luminant polymer layer 24 from reacting to the oxygen and moisture in the air. In addition, as the aluminum nitride 28 is a high thermal conductivity material, thereby the heat generated by the EL display can be dissipated through this aluminum nitride layer 28. Moreover, the aluminum nitride layer 28 as well as Al electrodes 26 can be deposited in subsequent sputtering process in the same chamber, which makes it advantageous for mass productions.

Figure 2D:
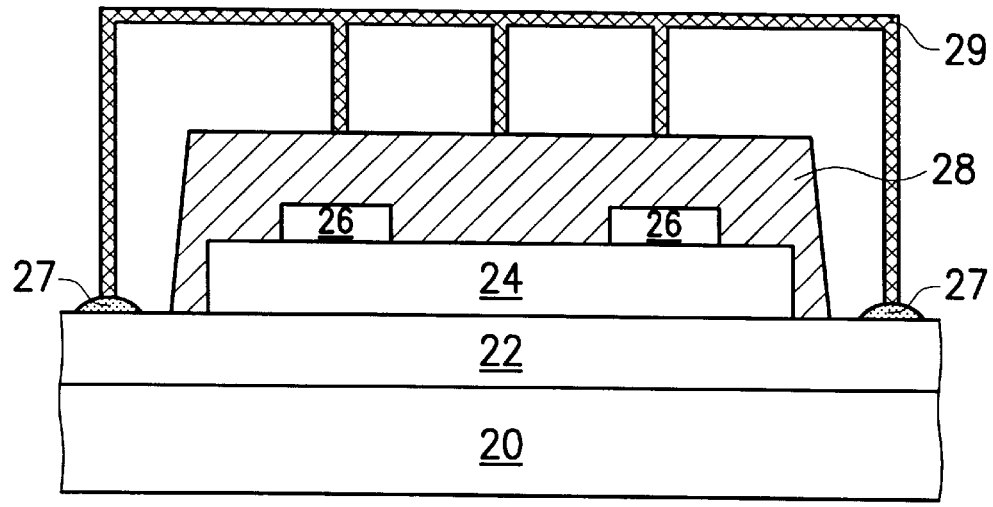

Then, referring to FIG. 2D, a packaging shell 29 with a plurality of grids set inside (as shown in FIG. 2C) was sealed on the top of the aluminum nitride layer 28 to consolidate the structure and enhance the effects of heat-dissipation. The sealing process was performed by using an agglutinant 27 consisting of epoxide to fix the packaging shell 29 on the top of the heat-dissipating layer under $N_2$. Briefly speaking, the packaging shell 29 was used to consolidate the structure of aluminum nitride 28 and provide a heat-conducting mechanism for heat-dissipation. The packaging shell 29 could also prevent the cathode 26 and the organic luminant polymer layer 24 from reacting to the oxygen and moisture in the air by means of filling the nitrogen between the packaging shell 29 and the aluminum nitride 24.

Embodiment 2

Figure 3A:
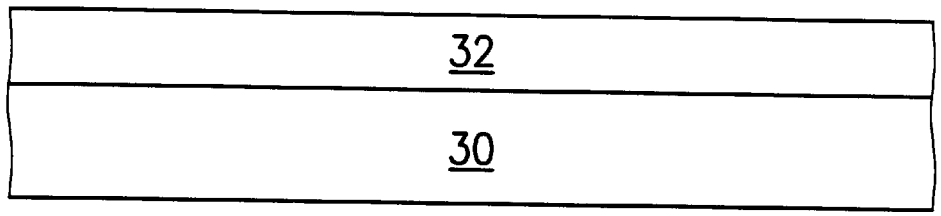

First, referring to FIG. 3A, an ITO glass 30 was provided. Then the ITO glass 30 was patterned into a plurality of blocks 32 as anodes of organic polymer EL display by means of photolithography and etching.

Figure 3B:
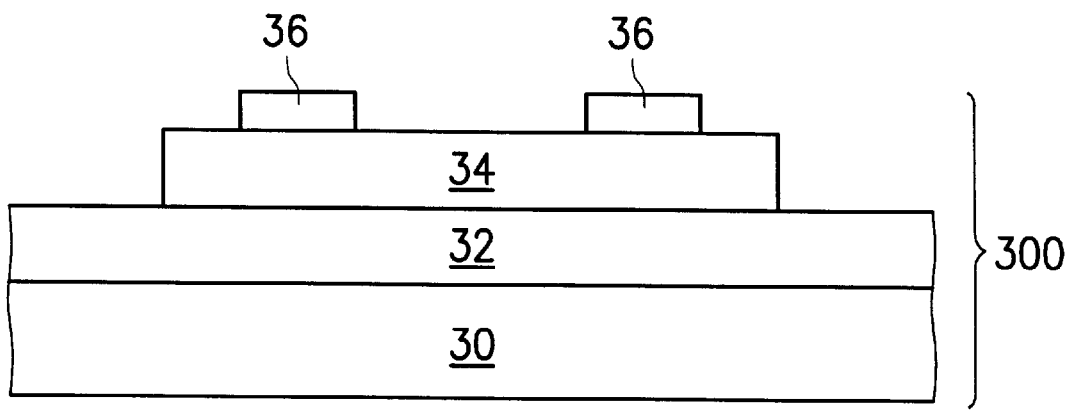

Next, referring to FIG. 3B, the luminant PPV or related series was coated on the top of the ITO pattern 32 to form an organic polymer luminant layer 34. Then, Al electrodes 36 were deposited on the top of the organic polymer luminant layer 34 as cathodes of the organic polymer EL display, and an organic polymer EL display 300 was generated.

Figure 3C:
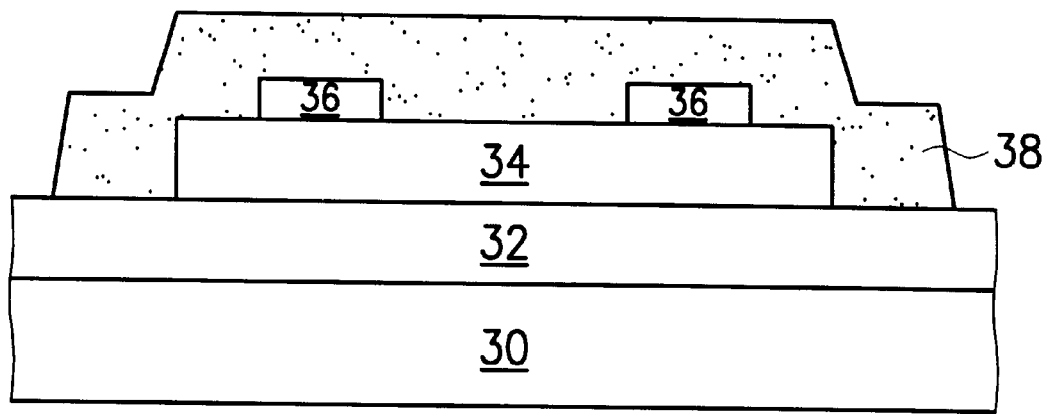

Next, referring to FIG. 3C, an aluminum nitride ($AlN_x$) layer 38 was deposited to cover Al electrodes 36 and the organic polymer luminant layer 34 by sputtering process. This aluminum nitride layer 38 can prevent Al electrodes 36 and the polymer luminant layer 34 from reacting to the oxygen and moisture in the air. In addition, the aluminum nitride 38 is a high thermal conductive material, thereby the heat generated by the EL display can be dissipated through this aluminum nitride layer 38. Moreover, the aluminum nitride layer 38 as well as Al electrodes 36 can be deposited in subsequent sputtering process in the same chamber, which makes it advantageous for mass production.

Figure 3D:
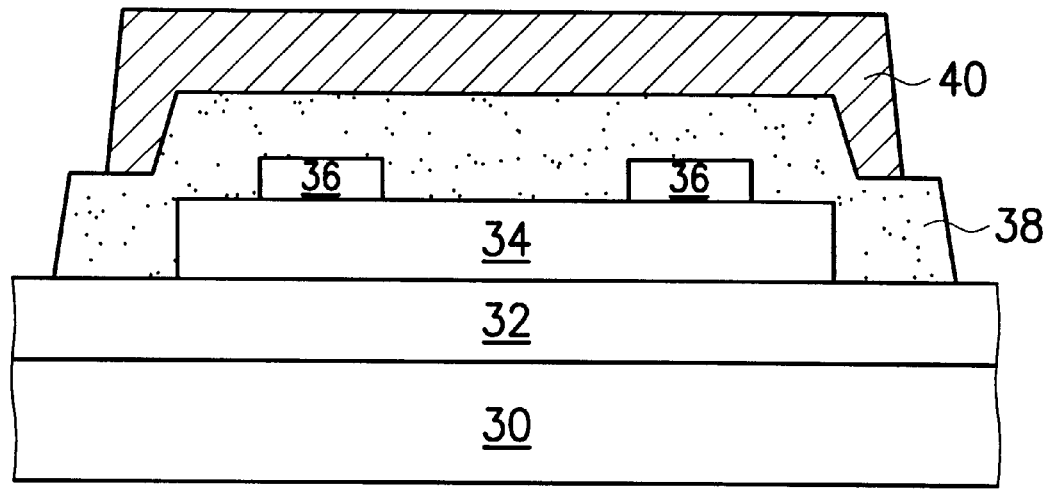

Then referring to FIG. 3D, a covering layer 40 consisting of a high thermal conductivity metal such as copper was deposited on the top of the aluminum nitride layer 38 by sputtering process. The covering layer 40 was used not only to consolidate the structure of aluminum nitride 38 but also enhance the effect of heat-dissipation.

From the above description, one skilled in this art can easily ascertain the essential characteristics of the present invention, and, without departing from the spirit and scope thereof, can make various changes and modifications of the invention to adapt it to various usage and conditions. Thus, other embodiments also fall within the scope of the following claims.

What is claim is:

1. A packaging method for organic polymer EL displays, the steps comprising:
   (1) providing a glass substrate with an EL display device formed thereon, comprises a transparent electrode used as an anode on the glass substrate, an organic polymer layer coated on the top of the anode, and a metallic electrode used as a cathode formed on the top of the organic polymer layer;
   (2) forming a heat-dissipating layer to passivate the cathode and the organic polymer layer; and
   (3) providing a packaging shell with a plurality of grids set inside, and sealing the heat-dissipating layer with the packaging shell under $N_2$.

2. The method as claimed in claim 1, wherein the transparent electrode consists of ITO.

3. The method as claimed in claim 1, wherein the organic polymer consists of organic luminant polymers.

4. The method as claimed in claim 1, wherein the metallic electrode consists of electron-injecting materials.

5. The method as claimed in claim 1, wherein the metallic electrode consists of Al.

6. The method as claimed in claim 1, wherein the heat-dissipating layer consists of insulators with high thermal conductivity.

7. The method as claimed in claim 1, wherein the heat-dissipating layer consists of $AlN_x$.

8. The method as claimed in claim 7, wherein the $AlN_x$ layer is formed by means of sputtering.

9. The method as claimed in claim 1, wherein the packaging shell consists of metals with high thermal conductivity.

10. The method as claimed in claim 1, wherein the sealing step is performed by using an agglutinant to fix the packaging shell on the top of the heat-dissipating layer.

11. The method as claimed in claim 10, wherein the agglutinant consists of epoxide resin.

* * * * *